United States Patent
Zhang et al.

(10) Patent No.: US 8,081,441 B2
(45) Date of Patent: Dec. 20, 2011

(54) STORAGE DEVICE

(75) Inventors: Yang Zhang, Shanghai (CN);
Yong-Liang Hu, Shanghai (CN);
Tsai-Kuei Cheng, Taipei (CN)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 12/825,658

(22) Filed: Jun. 29, 2010

(65) Prior Publication Data
US 2011/0279964 A1    Nov. 17, 2011

(30) Foreign Application Priority Data

May 13, 2010    (CN) .......................... 2010 1 0175951

(51) Int. Cl.
*H05K 5/00* (2006.01)
*H05K 7/00* (2006.01)
(52) U.S. Cl. ......... 361/679.33; 361/679.32; 361/679.46; 361/679.48; 361/724
(58) Field of Classification Search ............. 361/679.32, 361/679.33, 679.46, 679.48, 724
See application file for complete search history.

(56) References Cited

U.S. PATENT DOCUMENTS

| | | | |
|---|---|---|---|
| 6,970,346 B2 * | 11/2005 | Shih | 361/679.02 |
| 7,639,486 B2 * | 12/2009 | Champion et al. | 361/679.32 |
| 2005/0018388 A1 * | 1/2005 | Shih | 361/679 |
| 2009/0152216 A1 * | 6/2009 | Champion et al. | 211/26 |

* cited by examiner

*Primary Examiner* — Anthony Haughton
(74) *Attorney, Agent, or Firm* — J.C. Patents

(57) ABSTRACT

A storage device suitable to be installed on a rack includes a case, a plurality of storage units, a power module, a management module and an adapting board, wherein the case includes a bottom board, a first side wall, a second side wall and a partition board. The partition board is located over the bottom board to divide the case into an upper and a lower accommodation spaces. The storage units are disposed in the upper accommodation space and the power module is disposed in the lower accommodation space. The power module includes a power backboard and power suppliers plugged at the power backboard. The management module disposed in the lower accommodation space has an expanding interface. The adapting board is disposed in the lower accommodation space and electrically connected to the power backboard, the management module and the storage units.

11 Claims, 4 Drawing Sheets

STORAGE DEVICE

CROSS-REFERENCE TO RELATED APPLICATION

This application claims the priority benefit of China application serial no. 201010175951.4, filed May 13, 2010. The entirety of the above-mentioned patent application is hereby incorporated by reference herein and made a part of this specification.

BACKGROUND OF THE INVENTION

1. Field of the Invention

The present invention generally relates to a storage device, and more particularly, to a storage device with a new configuration.

2. Description of Related Art

Along with the network progress, the performance of the storage device serving as a network equipment has been durably enhanced. With more and more network resources, the requirement on the storage device specialized for storing data has been also ceaselessly advanced. Specialized for storing network data, storage device is carried by a server together in use. Since the storage device and the server are together installed on a rack, so that the appearance of the storage device is quite similar to the server and has a case. The front end of the case has a front panel, and when the case is installed on a rack, the front panel exposed at the front end of the rack is provided to a user for operation. The most important subassembly of a storage device is hard disks. The storage capacity of a storage device, i.e., how many hard disks can be inserted, is the most important technical index thereof. A number of the hard disks causes many problems, such as layout difficulty, heat-dissipating and convenience availability of plug/unplug.

In sort, how to provide a storage device with a large capacity which is able to install more hard disks and provide a reasonable layout and convenience of installing each subassembly has become an important subject already.

SUMMARY OF THE INVENTION

Accordingly, the present invention is directed to a storage device unique from the prior art, wherein the internal components are re-disposed so that the storage device is advantageous in optimizing the space utilization, increasing the arrangement density of the hard disks and enhancing the ventilation effect.

The present invention provides a storage device suitable to be installed on a rack includes a case, a plurality of storage units, a power module, a management module and an adapting board, wherein the case includes a bottom board, a first side wall, a second side wall and a partition board. The partition board is located over the bottom board to divide the case into an upper accommodation space and a lower accommodation space. The storage units are disposed in the upper accommodation space, while the power module is disposed in the lower accommodation space for supplying power to the storage device. The power module includes a power backplane and a plurality of power suppliers plugged at the power backplane. The management module is disposed in the lower accommodation space and has at least one expanding interface for externally connecting at least one server providing storage units or externally connecting at least one storage unit to expand the capacity of the storage device, and the management module simultaneously manages the storage units. The adapting board is disposed in the lower accommodation space and electrically connected to the power backplane, the management module and the storage units.

In an embodiment of the present invention, the above-mentioned adapting board is disposed close to the first side wall, and the second side wall has a first opening at the lower accommodation space. In addition, the power backplane is vertically plugged at the adapting board and perpendicular to the first side wall. The power backplane is suitable to be swapped through the first opening. In addition, the management module is vertically plugged at the adapting board and perpendicular to the first side wall, and the management module is suitable to be swapped through the first opening.

In an embodiment of the present invention, wherein a second opening is disposed at the rear end of the above-mentioned lower accommodation space, and the power suppliers are vertically plugged at the power backplane and swapped through the second opening.

In an embodiment of the present invention, the above-mentioned storage units respectively include a hard disk backplane and a plurality of hard disks, wherein the hard disk backplanes lay on the partition board and respectively include a plurality of first connection ports and a second connection port. The second connection port is coupled to the adapting board, and the hard disks are perpendicular to the hard disk backplane and inserted with the first connection ports. The storage device further includes a plurality of cables for connecting the hard disk backplane and the adapting board. An end of each cable is plugged into the second connection port, the first side wall has a third opening, and an end of the hard disk backplane and the adapting board are exposed at the third opening so as to swap the cables. In addition, the upper portion of the upper accommodation space has a fourth opening, the first connection ports are disposed towards the fourth opening, and the hard disks are vertically plugged/unplugged at the upper accommodation space through the fourth opening. The first side wall further has a swinging wall for movably locking with the first side wall, so that the swinging wall can be open or close relatively to the first side wall to cover the third opening.

In an embodiment of the present invention, the storage device further includes a plurality of fans disposed at the rear end of the upper accommodation space and suitable to perform heat-dissipating on the storage units. Moreover, the storage device includes a cable aim, wherein an end of the cable arm is fixed at the rear end of the case, and another end thereof is fixed on the rack. When the storage device is installed on the rack, the cable arm is folded and accommodated between the fans and the partition board.

Based on the depiction above, the storage device of the present invention is a novel architecture, and each subassembly disposed in the storage device has a re-disposing position in the case, which is advantageous in not only effectively utilizing the space in the case, but also increasing the arrangement density of the hard disks, increasing the quantity of the hard disks in use and advancing the heat-dissipating effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
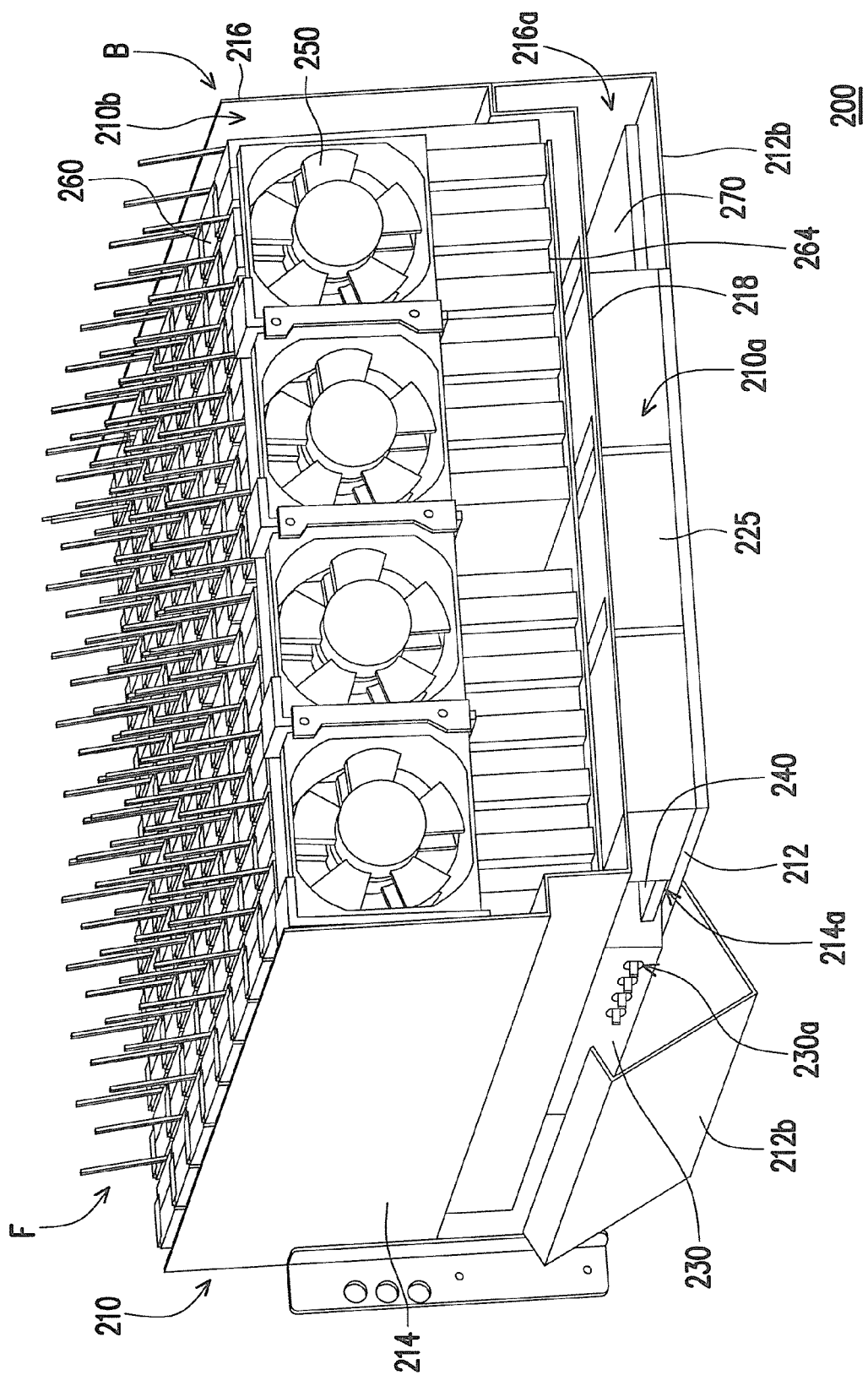
FIG. 1 is a diagram of a storage device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
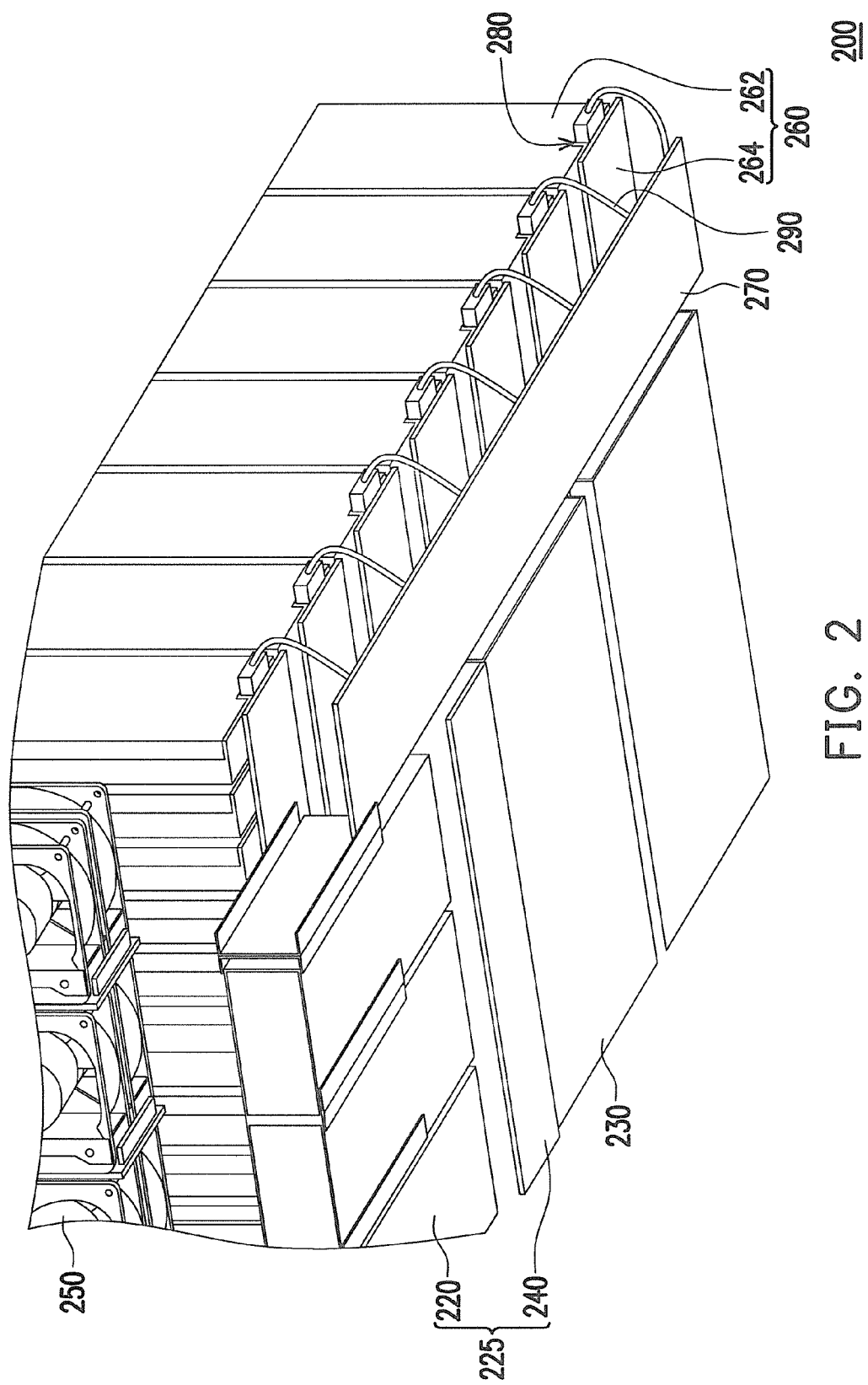
FIG. 2 is a diagram of the storage device of FIG. 1 where the case is omitted.
Figure 3:
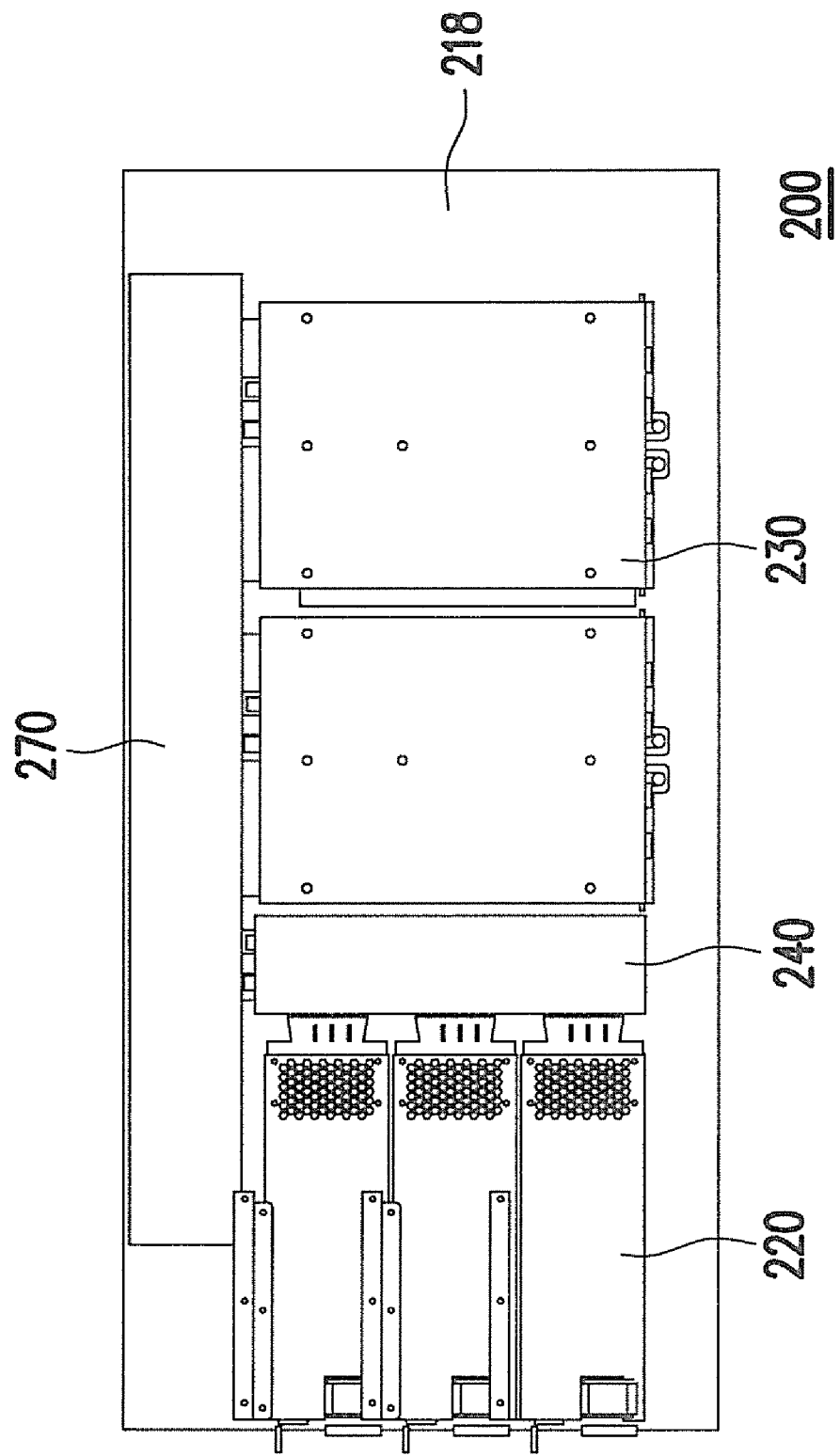
FIG. 3 is a down view of FIG. 2.
Figure 4:
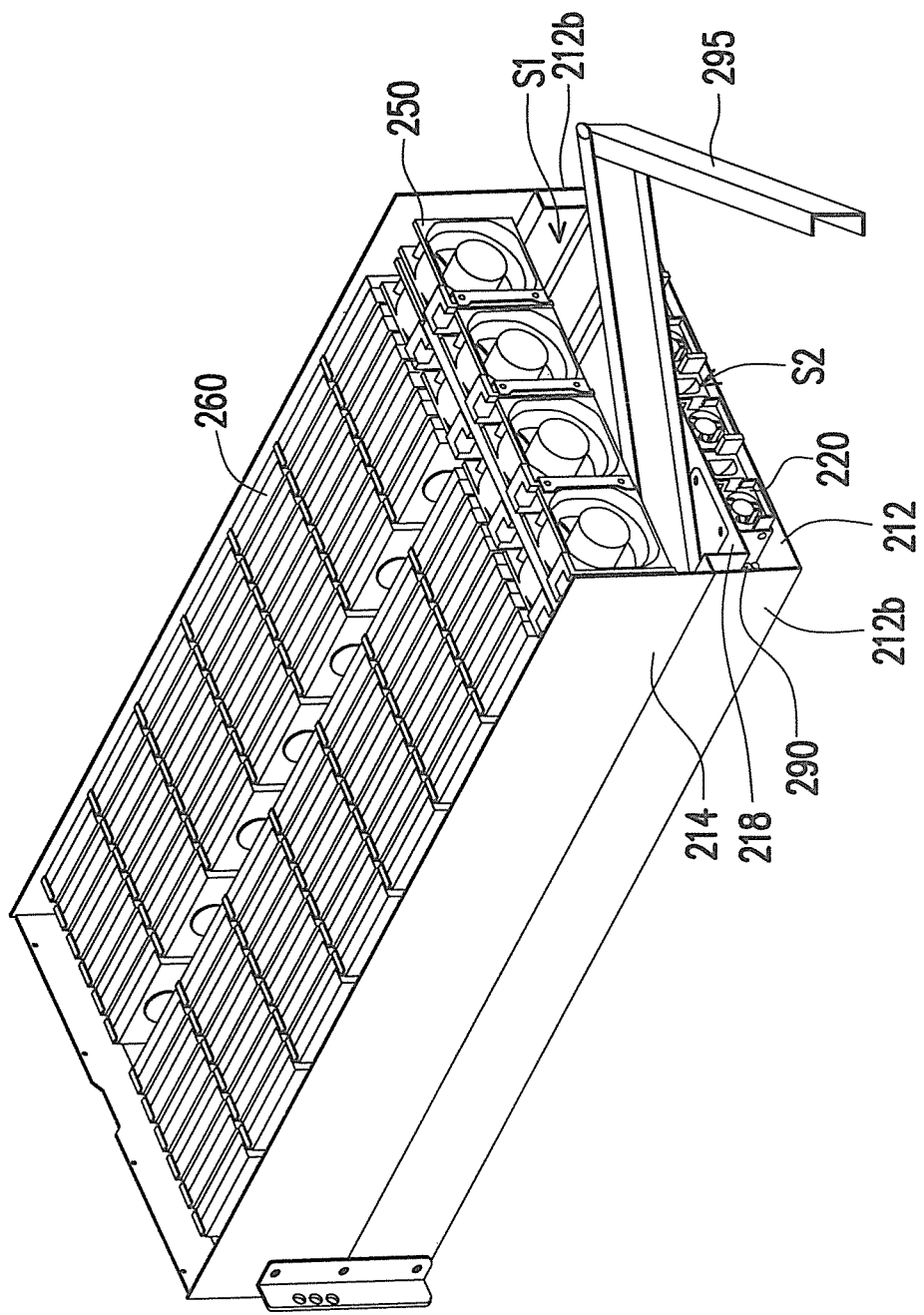
FIG. 4 is a diagram of the storage device of FIG. 1 where the cable arm thereof is extended out.

FIG. 1 is a diagram of a storage device according to an embodiment of the present invention, FIG. 2 is a diagram of the storage device of FIG. 1 where the case is omitted and FIG. 3 is a down view of FIG. 2, wherein FIGS. 1, 2 and 3 are different angles in view of the storage device and FIG. 4 is a diagram of the storage device of FIG. 1 where the cable arm thereof is extended out. The storage device 200 includes a case 210, a power module 225, a management module 230, an adapting board 270 and a plurality of storage units 260. The case 210 includes a bottom board 212, a first side wall 216, a second side wall 214 and a partition board 218. The partition board 218 is located over the bottom board 212 to divide the case 210 into an upper accommodation space S1 and a lower accommodation space S2. The management module 230 is disposed in the lower accommodation space S2 and located at a side of the case 210. The management module 230 has at least one expanding interface 230a for externally connecting at least one server providing storage units or at least one storage unit to expand the capacity of the storage device. The management module 230 simultaneously manages a plurality of storage units 260. The power module 225 is disposed in the lower accommodation space S2 and located at the rear side of the case 210. The power module 225 includes a plurality of power suppliers 220 and a power backplane 240, wherein the power suppliers 220 are inserted at the power backplane 240 and located at the rear side of the case 210. In detail, the power backplane 240 is disposed on the bottom board 212 and located between the power suppliers 220 and the management module 230. The storage units 260 are disposed in the upper accommodation space S1 and located over the management module 230 and the power module 225. The adapting board 270 is disposed in the lower accommodation space S2 and located at a side of the management module 230. The adapting board 270 is electrically connected to the power backplane 240 of the power module 225, the management module 230 and the storage units 260. The present invention provide a new configuration of the storage device 200, the internal components thereof are re-disposed, the space inside the case 210 can be more effectively utilized, and the arrangement density of the storage units 260 can be increased so as to increase the quantity of the storage device 200 in use.

The adapting board 270 is disposed close to the first side wall 216, and the second side wall 214 has a plurality of first openings 214a at the lower accommodation space S2. In addition, the power backplane 240 is vertically plugged at the adapting board 270 and perpendicular to the first side wall 216. The power backplane 240 is suitable to be swapped through a first opening 214a. The management module 230 is vertically plugged at the adapting board 270 and perpendicular to the first side wall 216. The management module 230 is suitable to be swapped in the same installation direction as the power backplane 240 through a first opening 214a.

A second opening 210a is disposed at the rear end B of the lower accommodation space S2. The power suppliers 220 are vertically plugged at the power backplane 240 and swapped through the second opening 210a.

Each of the storage units 260 has a plurality of hard disks 262 and a hard disk backplane 264, wherein the hard disk backplane 264 lays on the partition board 218 and is coupled to the adapting board 270, each hard disk backplane 264 includes a plurality of first connection ports (not shown) and a second connection port 280. The second connection port 280 is coupled to the adapting board 270, and the hard disks 262 are vertically inserted with the first connection ports of the hard disk backboard 264. The storage device 200 further includes a plurality of cables 290 connected between the second connection port 280 of the hard disk backplane 264 and the adapting board 270. In addition, the first side wall 216 has a third opening 216a, while the second connection port 280 of the hard disk backplane 264 and the adapting board 270 are exposed at the third opening 216a so that the user can conveniently swap the cables 290. The top portion of the upper accommodation space S1 has a fourth opening 210b, and the first connection ports are oriented towards the fourth opening 210b so that the hard disks 262 can be vertically swapped in the upper accommodation space S1 through the fourth opening 210b. In addition, the first side wall 216 further has a swinging wall 212b to movably lock with the first side wall 216. The swinging wall 212b can be open or close relatively to the first side wall 216 to cover the third opening 216a. The swinging wall 212b can be disposed at both sides of the bottom board 212, so that the user can open or close the swinging wall 212b relatively to the bottom board 212 so as to install the management module 230 and the externally connecting cables; besides, the structure of the hard disk backplane 264 connecting the adapting board 270 and the storage units 260 is further advantageous in convenience of detaching and replacing, and moreover, swapping the cables 290 connected between the hard disk backplane 264 and the adapting board 270. The cables 290 can be placed at the swinging wall 212b, wherein the use quantity and the disposing position of the swinging wall 212b can be modified according to actual requirements.

The storage device 200 further includes a plurality of fans 250, which are disposed at the rear end B of the upper accommodation space S1 and located roughly over the power module 225 to perform heat-dissipating on the storage units 260. The fans 250 are directly arranged beside the storage units 260. Since there is no block between the fans 250 and the storage units 260, the air flow of the fans 250 can effectively advance the heat-dissipating effect inside the storage device 200.

Specially, inside the storage device 200, the storage units 260 and the fans 250 are disposed at the upper accommodation space S1 in the case 210, the power suppliers 220 and the management module 230 are disposed at the lower accommodation space S2 in the case 210, and the adapting board 270 is located under the hard disk backplane 264 of the storage units 260, so that the hard disk backplane 264 of the storage units 260 is more directly and conveniently electrically connected to the adapting board 270.

In other unshown embodiments, an additional connection board having connection ports disposed aside is used and so as to electrically connect the hard disk backplane 264 of the storage units 260 to the adapting board 270, while the power signal transmitted from the power backplane 240 is input to the storage units 260. In other words, the connection board has both cable function and connection interface function.

The storage device 200 further includes a cable arm 295, wherein an end of the cable arm 295 is fixed at the rear end B of the case 210 and the other end thereof is fixed at the rack (not shown). When the storage device 200 is installed on the rack (not shown), the cable arm 295 is folded and accommodated between the fans 250 and the partition board 218, wherein a part of the cables 290 are placed at the cable arm 295 so as to avoid the cables 290 from being twisted and improve tidiness and nice look.

In summary, the storage device of the present invention has at least following advantages:
1. The subassemblies in the case of the storage device are re-disposed, which makes the space in the case more effectively utilized and increases the quantity of the storage units in use and the arrangement density of the storage units.
2. After re-disposing, the adapting board is located under the hard disk backplane of the storage units so that the connecting way between the adapting board and the hard disk backplane of the storage units is much easier.
3. After re-disposing, each of the boards and the hard disks are conveniently swapped through the openings of the case, which advances the expandability and the replacing convenience.
4. The fans are directly arranged beside the storage units where there is no block between the fans and the storage units, therefore, the air flow of the fans can effectively advance the heat-dissipating effect inside the storage device.
5. By disposing the swinging wall able to open and close relatively to the bottom board on the case, the user can conveniently replace or detach the subassemblies in the case after the swinging wall opens relatively to the bottom board.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A storage device, suitable to be installed on a rack, and the storage device comprising:
   a case, comprising a bottom board, a first side wall, a second side wall and a partition board, wherein the partition board is located over the bottom board to divide the case into an upper accommodation space and a lower accommodation space;
   a plurality of storage units, disposed in the upper accommodation space;
   a power module, disposed in the lower accommodation space for supplying power to the storage device and comprising:
      a power backplane;
      a plurality of power suppliers, plugged at the power backplane;
   a management module, disposed in the lower accommodation space and having at least one expanding interface for externally connecting at least one server providing a plurality of storage units or externally connecting at least one storage unit to expand the capacity of the storage device, wherein the management module simultaneously manages the storage units; and
   an adapting board, disposed in the lower accommodation space and electrically connected to the power backplane, the management module and the storage units.

2. The storage device as claimed in claim 1, wherein the adapting board is disposed close to the first side wall, and the second side wall has a first opening at the lower accommodation space.

3. The storage device as claimed in claim 2, wherein the power backplane is vertically plugged at the adapting board and perpendicular to the first side wall, and the power backplane is suitable to be swapped through the first opening.

4. The storage device as claimed in claim 1, wherein a second opening is disposed at the rear end of the above-mentioned lower accommodation space, and the power suppliers are vertically plugged at the power backplane and swapped through the second opening.

5. The storage device as claimed in claim 2, wherein the management module is vertically plugged at the adapting board and perpendicular to the first side wall, and the management module is suitable to be swapped through the first opening.

6. The storage device as claimed in claim 1, wherein the storage units respectively comprise:
   a hard disk backplane, laying on the partition board and respectively comprises a plurality of first connection ports and a second connection port, wherein the second connection port is coupled to the adapting board; and
   a plurality of hard disks, perpendicular to the hard disk backplane and inserted with the first connection ports.

7. The storage device as claimed in claim 6, further comprising a plurality of cables for connecting the hard disk backplane and the adapting board, wherein an end of each cable is plugged into the second connection port, the first side wall has a third opening, and an end of the hard disk backplane and the adapting board are exposed at the third opening so as to swap the cables.

8. The storage device as claimed in claim 6, wherein the upper portion of the upper accommodation space has a fourth opening, the first connection ports are disposed towards the fourth opening, and the hard disks are vertically plugged/unplugged at the upper accommodation space through the fourth opening.

9. The storage device as claimed in claim 1, further comprising a plurality of fans disposed at the rear end of the upper accommodation space and suitable to perform heat-dissipating on the storage units.

10. The storage device as claimed in claim 9, further comprising a cable arm, wherein an end of the cable arm is fixed at the rear end of the case, and another end thereof is fixed on the rack, and when the storage device is installed on the rack, the cable arm is folded and accommodated between the fans and the partition board.

11. The storage device as claimed in claim 7, wherein the first side wall further has a swinging wall for movably locking with the first side wall, so that the swinging wall can be open or close relatively to the first side wall to cover the third opening.

* * * * *